(12) United States Patent
Chen

(10) Patent No.: US 8,278,563 B1
(45) Date of Patent: Oct. 2, 2012

(54) VIA TO PLATING BUS

(75) Inventor: Chender Chen, Fongyuan (TW)

(73) Assignee: Marvell International Ltd., Hamilton (BM)

( * ) Notice: Subject to any disclaimer, the term of this patent is extended or adjusted under 35 U.S.C. 154(b) by 863 days.

(21) Appl. No.: 12/059,739

(22) Filed: Mar. 31, 2008

Related U.S. Application Data

(60) Provisional application No. 60/908,831, filed on Mar. 29, 2007.

(51) Int. Cl.
*H05K 1/11* (2006.01)
(52) U.S. Cl. .......................................... 174/262; 174/266
(58) Field of Classification Search .................. None
See application file for complete search history.

(56) References Cited

U.S. PATENT DOCUMENTS

| | | | |
|---|---|---|---|
| 6,121,678 A * | 9/2000 | Chiu et al. ..................... 257/700 |
| 6,319,418 B1 | 11/2001 | Verdeflor et al. |
| 6,372,543 B1 * | 4/2002 | Chiu et al. ..................... 438/108 |
| 6,664,480 B2 * | 12/2003 | Drussel et al. ................ 174/255 |
| 7,065,869 B2 | 6/2006 | Kang et al. |
| 7,181,837 B2 * | 2/2007 | Johnson ........................... 29/846 |
| 7,375,009 B2 * | 5/2008 | Chua et al. ..................... 438/460 |
| 7,443,010 B2 * | 10/2008 | Tsao et al. ..................... 257/620 |
| 2002/0114507 A1 * | 8/2002 | Lynch et al. .................. 382/151 |
| 2005/0247481 A1 * | 11/2005 | Chen et al. .................... 174/261 |

* cited by examiner

*Primary Examiner* — Jayprakash N Gandhi
*Assistant Examiner* — Dion Ferguson

(57) ABSTRACT

Method and apparatuses directed to printed circuit boards (PCB) including plated through-holes for interconnecting to plating busses are described herein. A PCB strip may include an inner circuitry layer comprising a plurality of trace lines, and a top circuitry layer formed over the inner circuitry layer, the top circuitry layer including a plating bus, and at least one plated through-hole interconnecting the plating bus to one or more trace lines of the inner circuitry layer. The plating bus of the top circuitry layer and the plated through-holes may be located within at least one saw street of the PCB strip.

22 Claims, 4 Drawing Sheets

VIA TO PLATING BUS

CROSS-REFERENCE TO RELATED APPLICATIONS

The present application claims priority to U.S. Provisional Patent Application No. 60/908,831, filed Mar. 29, 2007, the entire disclosure of which is hereby incorporated by reference in its entirety.

TECHNICAL FIELD

Embodiments of the present invention relate to the field of microelectronics, in particular, to printed circuit boards.

BACKGROUND

In the current state of electronics, electronic packages and devices are often coupled to an underlying substrate such as a printed circuit board (PCB). The electronic packages themselves typically include a die that is mounted on top of a carrier substrate, which may also comprise a PCB. The die may be comprised of an electronic device such as a microprocessor, volatile memory, embedded passive components, and the like. Each of these substrates (i.e., die, carrier substrate, and PCB) is typically connected to another substrate using conductive pads and conductive interconnects.

PCBs are sometimes formed from a PCB strip, the PCB strip including a plurality of individual PCBs. The PCB strip may include multiple layers of printed circuits, which may, after separation of the individual PCBs, establish the electrical interconnections between electronic devices. To facilitate plating of the PCB strip, plating busses may be used. The plating busses are generally included in every circuit layer of the PCB strip and electrically short the whole PCB strip until the PCB strip is singulated to form the individual PCBs. In theory, the plating busses of every layer should align so that during singulation of the PCB strip, all plating busses are removed. Unfortunately, the plating busses may not necessarily align, which may lead to some plating busses being incompletely removed, resulting in electrical shorts of devices to be mounted to the PCB.

SUMMARY OF THE INVENTION

In view of the problems in the state of the art, embodiments of the invention are directed to PCB strips including a plating bus only on a top surface of the PCB strip. More specifically, with the foregoing and other items in view, there is provided, in accordance with various embodiments a printed circuit board (PCB) strip comprising an inner circuitry layer comprising a plurality of trace lines, and a top circuitry layer formed over the inner circuitry layer, the top circuitry layer including a plating bus, and at least one plated through-hole interconnecting the plating bus to one or more trace lines of the inner circuitry layer.

In various embodiments, the at least one plated through-hole intersects the plating bus.

In some embodiments, the at least one plated through-hole electrically shorts the inner circuitry layer with the plating bus.

In various embodiments, the plating bus is located within at least one saw street of the PCB strip. In some of these embodiments, the at least one plated through-hole is located within the saw street.

In various embodiments, the plating bus defines a plurality of PCB units. In various ones of these embodiments, at least one of the PCB units is a carrier substrate, and in some embodiments, at least one microelectronic die is mounted on the carrier substrate. In various embodiments, at least one of the PCB units is a system level substrate, and in some embodiments, at least microelectronic component is mounted on the system level substrate.

A method is also described. In various embodiments, a method for forming a PCB strip may comprise forming an inner circuitry layer over a substrate core, the inner circuitry layer including a plurality of trace lines, forming the top circuitry layer over the inner circuitry layer, the top circuitry layer including a plating bus, and forming at least one plated through-hole interconnecting the plating bus to at least one of the trace lines of the inner circuitry layer.

Another method is also described. In various embodiments, a method may comprise providing a PCB strip including an inner circuitry layer comprising a plurality of trace lines, and a top circuitry layer formed over the inner circuitry layer, the top circuitry layer including a plating bus, and the PCB strip further including at least one plated through-hole interconnecting the plating bus to one or more trace lines of the inner circuitry layer, and cutting the PCB strip along the plating bus to form a plurality of PCB units.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For purposes of this description, the phrase "NB" means A or B. The phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to printed circuit board (PCB) strips having a top circuitry layer including a plating bus and an inner circuitry layer without a plating bus, and at least one plated through-hole interconnecting the plating bus of the top circuitry layer to one or more trace lines of the inner circuitry layer. Connecting the inner circuitry layer to the plating bus of the top circuitry layer by way of the plated through-hole, rather than including a plating bus in the inner circuitry layer itself, may avoid shorting resulting from incomplete removal of the plating busses during singulation.

Figure 1:
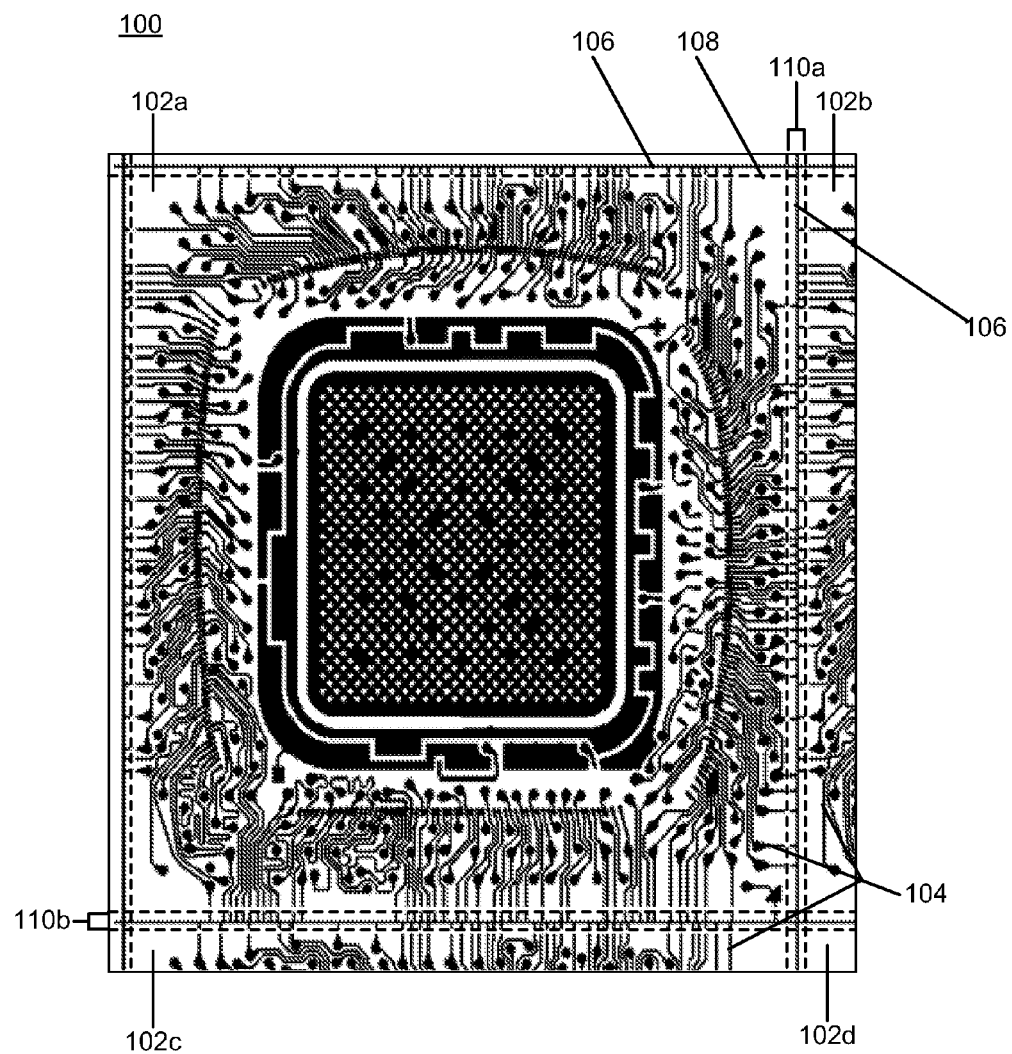
FIG. 1 illustrates a top view of a printed circuit board (PCB) strip known in the related art.

Illustrated at FIG. 1 is a top view of an exemplary multi-layer PCB strip known in the related art. As illustrated, PCB strip 100 includes a plurality of PCB units 102a-102d (only PCB unit 102a is illustrated in full, with partial views of PCB units 102b-102d). Since PCB strip 100 is a multi-layer PCB, it includes a top circuitry layer 104 and at least one inner circuitry layer (not illustrated), the circuitry layers including conductive trace lines and interconnects in a pre-determined pattern. Top circuitry layer 104 and inner circuitry layer(s) include plating busses 106 and 108, respectively, to electrically short PCB strip 100, for facilitating plating of PCB strip 100, until PCB strip 100 is singulated to form the individual PCB units 102a-102d.

During singulation, PCB strip 100 is cut along saw streets 110a, 110b, separating PCB units 102a-102d from each other. As illustrated, plating bus 106 is located within saw streets 110a, 110b and is removed by the sawing operation during singulation. As illustrated, however, plating bus 108 of the inner circuitry layer(s) is not aligned with plating bus 106 and is not even located within saw streets 110a, 110b. This may be due to any number of reasons including, for example, alignment tolerance limitations in PCB lamination. Since sawing machines generally align according to fiducial marks on the top layer of PCB strip 100, there may be incomplete removal of the plating bus 108 of inner circuitry layer(s), which may lead to electrical shorting of one or more of PCB units 102a-102d.

Figure 2A:
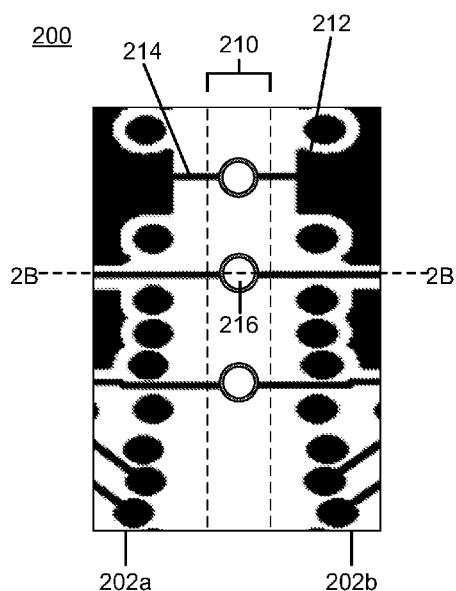
FIG. 2A illustrates a top view of an exemplary PCB strip in accordance with various embodiments of the present invention.
Figure 2B:
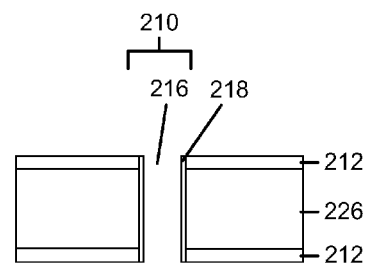
FIG. 2B illustrates a cross-sectional side view of the PCB strip of FIG. 2A.

Illustrated at FIG. 2A is a top view of inner circuitry layers 212 of a portion of a PCB strip 200 in accordance with various embodiments of the present invention. A cross-sectional side view of PCB strip 200 of FIG. 2A along line 2B-2B is illustrated at FIG. 2B. In contrast to PCB strip 100 of FIG. 1, inner circuitry layers 212 of PCB strip 200 do not include a plating bus. Rather, trace lines 214 of inner circuitry layers 212 are connected to plated through-holes 216 located within saw street 210. Plated through-holes 216 may be plated with a conductive material 218 to facilitate electrical shorting of PCB strip 200 until PCB strip 200 is singulated to form the individual PCB units 202a, 202b.

Figure 3A:
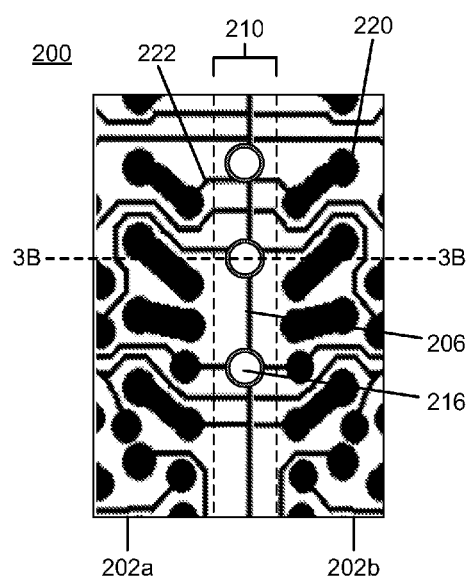
FIG. 3A illustrates a top view of the PCB strip of FIGS. 2A-2B including a top circuitry layer in accordance with various embodiments of the present invention.
Figure 3B:
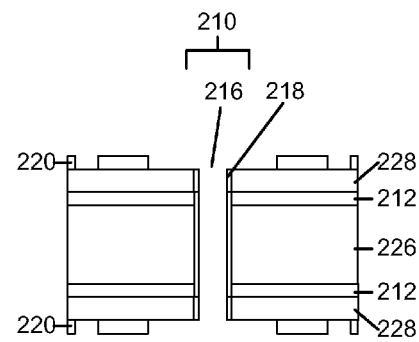
FIG. 3B illustrates a cross-sectional side view of the PCB strip of FIG. 3A

Illustrated at FIG. 3A and FIG. 3B, with continued reference to FIG. 2A and FIG. 2B, is a top circuitry layer 220 formed over inner circuitry layers 212. As with inner circuitry layers 212, top circuitry layer 220 includes trace lines 222. Top circuitry layer 220, however, includes a plating bus 206 located within saw street 210. Plated through-holes 216 intersect and are connected to plating bus 206 providing an electrically conductive path between inner circuitry layers 212 and plating bus 206, thereby electrically shorting PCB strip 200 until singulation at which time plating bus 206 and plated through-holes 216 are removed.

Inner circuitry layers 212 may be formed over a substrate core 226. Substrate core 226 may comprise any material suitable for the purpose including, for example, glass fiber, paper, or paper, any one or more of which may be impregnated with a resin or the like. Although the illustrated embodiments depict PCB strip 200 as being a double-side PCB, other configurations may be possible within the scope of the present invention. For example, in some embodiments, a PCB strip may be a single-sided PCB including circuitry layers on one side of substrate core 226.

Top and inner circuitry layers 220, 212 may comprise any material suitable for the purpose. For example, in various embodiments, one or both of top and inner circuitry layers 220, 212 may comprise copper. Top and/or inner circuitry layers 220, 212 may be plated with a suitable material including, for example, gold, silver, nickel, or leaded or lead-free solder. Other materials may be similarly suitable. In various embodiments, an intermediate layer 228 may be formed between top and inner circuitry layers 220, 212. Intermediate layer 228 may comprise any material suitable for separating circuitry layers including, for example, glass fiber, paper, or paper, any one or more of which may be impregnated with a resin or the like.

Moreover, although the illustrated embodiments depict PCB strip 200 as including only two circuitry layers 212, 220, more circuitry layers may be possible. In embodiments including more than two circuitry layers, trace lines of each of the inner circuitry layers may also be connected to plated through-holes 216 for electrical shorting to plating bus 206 of top circuitry layer 220.

Although the depicted embodiments include multiple plated through-holes 216, in various other embodiments a single plated through-hole may be sufficient. Moreover, plated through-holes 216 may be formed in a single operation after formation of inner and top circuitry layers 212, 220, or in some embodiments, may be formed in successive operations during or after formation of each circuitry layer.

Figure 4A:
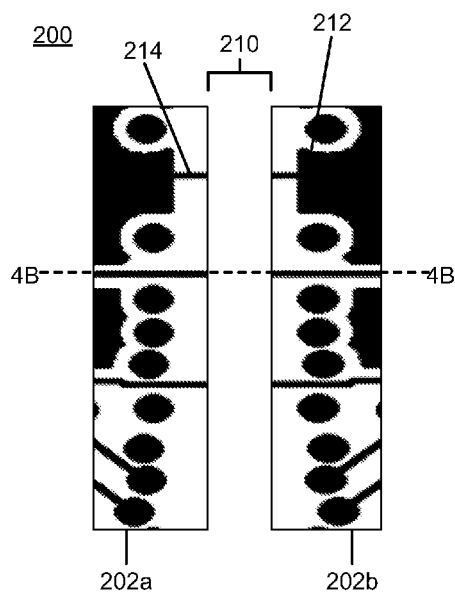
FIG. 4A illustrates a top view of the PCB strip of FIGS. 2A-3B after singulation in accordance with various embodiments of the present invention.
Figure 4B:
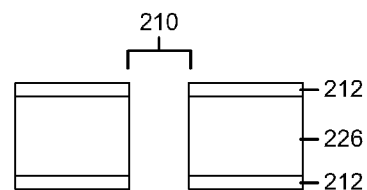
FIG. 4B illustrates a cross-sectional side view of the PCB strip of FIG. 4A.
Figure 5A:
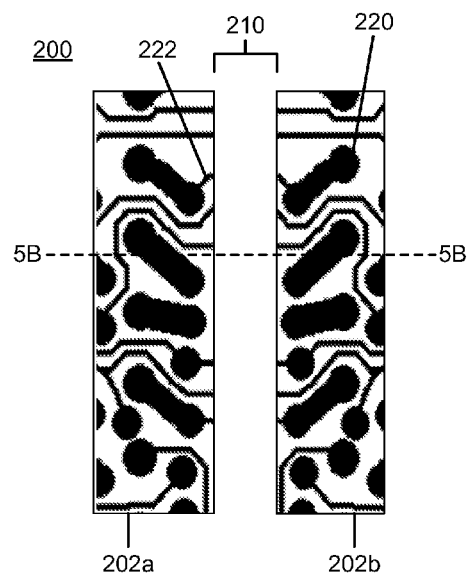
FIG. 5A illustrates a top view of the PCB strip of FIGS. 4A-4B including a top circuitry layer in accordance with various embodiments of the present invention.
Figure 5B:
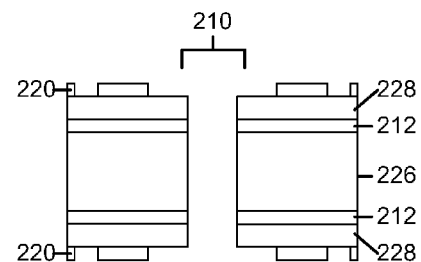
FIG. 5B illustrates a cross-sectional side view of the PCB strip of FIG. 5A.

In various embodiments, plating bus 206 is formed to define PCB units 202a, 202b. Accordingly, during singulation, a saw machine may essentially use plating bus 206 as a visual guide by which to singulate PCB units 202a, 202b. In various embodiments, plating fiducial marks (not illustrated) may be formed along with plating bus 206 to which the saw machine may align. As illustrated at FIGS. 4A-4B and FIGS. 5A-5B, PCB strip 200 has been cut along saw street 210, thereby singulating PCB units 202a, 202b. FIG. 4A illustrates a top view of inner circuitry layer 212 after cutting and FIG. 5A illustrates a top view of top circuitry layer 220 after cutting. Side views of PCB strip 200 after cutting are illustrated at FIG. 4B and FIG. 5B.

Since plated through-holes 216 intersect plating bus 206, plated through-holes 216 are removed along with plating bus 206 during the cutting operation. The lack of plating busses in inner circuitry layer 212 avoids altogether the possible shorting problems resulting from incomplete removal of inner plating busses as encountered with the related art such as, for example, that seen at FIG. 1. Rather, cutting along plating bus 206 ensures complete removal of plating bus 206 and plated through-holes 216.

Figure 6:
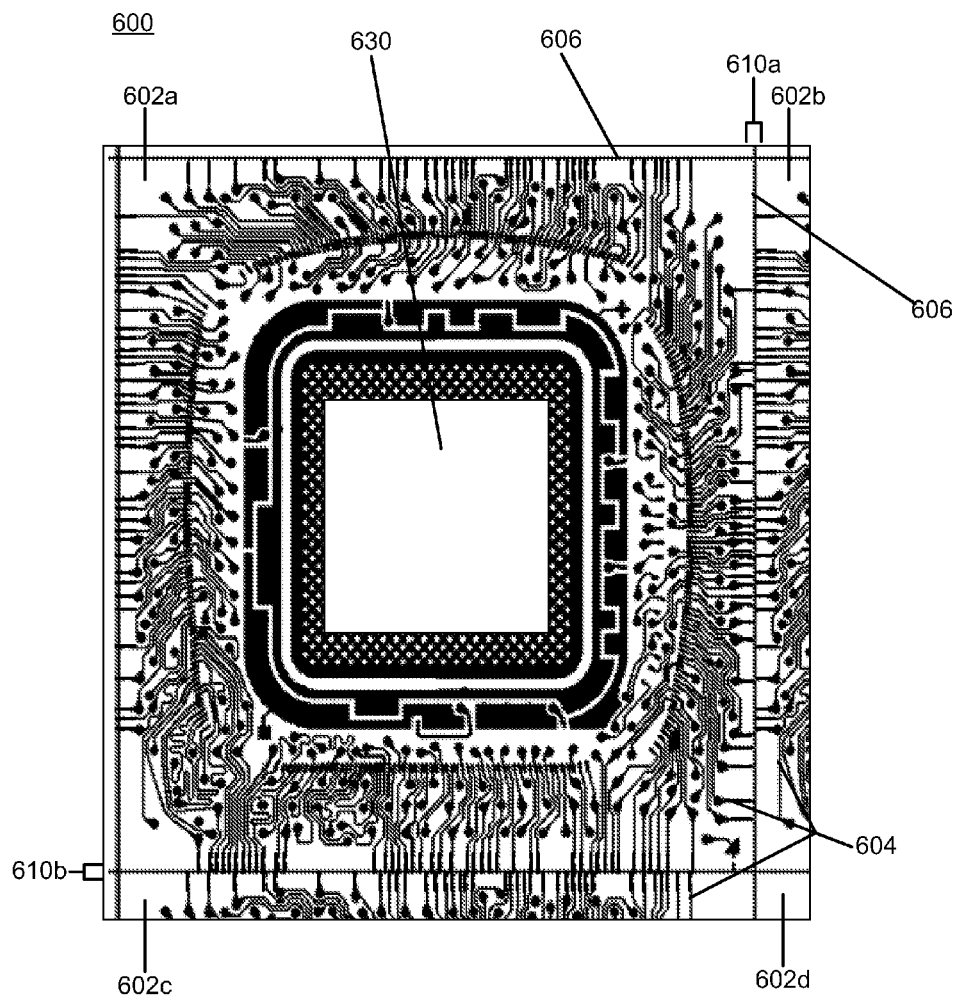
FIG. 6 illustrates a top view of another exemplary PCB strip in accordance with various embodiments of the present invention.

PCB strips in accordance with various embodiments of the present invention may be used for forming PCB units suitable for use as carrier substrates or system level substrates. As illustrated at FIG. 6, for example, is a top view of a multi-layer PCB strip 600 including PCB units 602a-602d (only PCB unit 602a is illustrated in full, with partial views of PCB units 602b-602d). As illustrated, PCB unit 602a includes a device 630 mounted thereon. In embodiments wherein PCB unit 602a comprises a carrier substrate, device 630 may comprise a microelectronic die. On the other hand, in embodiments wherein PCB unit 602a comprises a system level substrate, device 630 may comprise a microelectronic component (for example, a packaged microelectronic die).

Since PCB strip 600 is a multi-layer PCB, it includes a top circuitry layer 604 and at least one inner circuitry layer (not illustrated), the circuitry layers including conductive trace lines and interconnects in a pre-determined pattern. Top circuitry layer 604 includes a plating bus 606 located in saw streets 610a, 610b. Top circuitry layer 604 may be connected to plated through-holes (not illustrated) to electrically short PCB strip 600, for facilitating plating of PCB strip 600, until PCB strip 600 is singulated along saw streets 610a, 610b to form the individual PCB units 602a-602d.

Advantageously, a saw machine may essentially use plating bus 606 as a visual guide by which to singulate PCB units 602a-602d. In various embodiments, plating fiducial marks (not illustrated) may be formed along with plating bus 606 to which the saw machine may align during singulation. Since the plated through-holes intersect plating bus 606, the plated through-holes are removed along with plating bus 606 during the cutting operation. The lack of plating busses in inner circuitry layers avoids altogether the possible shorting problems resulting from incomplete removal of inner plating busses as encountered with the related art such as, for example, that seen at FIG. 1.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A printed circuit board (PCB) strip comprising:
    an inner circuitry layer comprising a plurality of trace lines, wherein the inner circuitry layer does not include a plating bus;
    a top circuitry layer formed over the inner circuitry layer, the top circuitry layer including a plating bus; and
    at least one plated through-hole located within at least one saw street of the PCB strip, the at least one plated through-hole interconnecting the plating bus of the top circuitry layer to one or more of the plurality of trace lines of the inner circuitry layer,
    wherein the at least one plated through-hole is plated with a conductive material to facilitate electrical shorting of the PCB strip, and
    wherein the at least one plated though-hole is disposed such that the entire circumference of the at least one plated through-hole is disposed completely within the at least one saw street of the PCB strip.

2. The PCB strip of claim 1, wherein the at least one plated through-hole intersects the plating bus.

3. The PCB strip of claim 1, wherein the at least one plated through-hole electrically shorts the inner circuitry layer with the plating bus.

4. The PCB strip of claim 1, wherein the plating bus is located within the at least one saw street of the PCB strip.

5. The PCB strip of claim 1, wherein the plating bus defines a plurality of PCB units.

6. The PCB strip of claim 5, wherein at least one of the PCB units is a carrier substrate.

7. The PCB strip of claim 6, further comprising at least one microelectronic die mounted on the carrier substrate.

8. The PCB strip of claim 5, wherein at least one of the PCB units is a system level substrate.

9. The PCB strip of claim 8, further comprising at least one microelectronic component mounted on the system level substrate.

10. A method for forming a printed circuit board (PCB) strip, the method comprising:
    forming an inner circuitry layer over a substrate core, the inner circuitry layer including a plurality of trace lines, wherein the inner circuitry layer is formed such that the inner circuitry layer does not include a plating bus;
    forming a top circuitry layer over the inner circuitry layer, the top circuitry layer including a plating bus; forming at least one plated through-hole interconnecting the plating bus of the top circuitry layer to at least one of the plurality of trace lines of the inner circuitry layer; and
    coating the at least one plated through-hole with a conductive material to facilitate electrical shorting of the PCB strip,
    wherein the plating bus is formed within at least one saw street of the PCB strip, and
    wherein the at least one plated though-hole is disposed such that the entire circumference of the at least one plated through-hole is disposed completely within the at least one saw street of the PCB strip.

11. The method of claim 10, wherein the at least one plated through-hole is formed to intersect the plating bus.

12. The method of claim 10, wherein the at least one plated through-hole electrically shorts the inner circuitry layer with the plating bus.

13. The method of claim 10, wherein the at least one plated through-hole is formed within at least one saw street.

14. The method of claim 10, further comprising cutting along the plating bus to form a plurality of PCB units.

15. The method of claim 14, wherein at least one of the PCB units is a carrier substrate.

16. The method of claim 14, wherein at least one of the PCB units is a system level substrate.

17. A method comprising:
   providing a printed circuit board (PCB) strip including an inner circuitry layer, the inner circuitry layer comprising a plurality of trace lines, wherein the inner circuitry layer does not include a plating bus;
   providing a top circuitry layer formed over the inner circuitry layer, the top circuitry layer including a plating bus;
   cutting the PCB strip along the plating bus to form a plurality of PCB units,
   wherein the PCB strip further includes at least one plated through-hole interconnecting the plating bus of the top circuitry layer to one or more of the plurality of trace lines of the inner circuitry layer, and
   wherein cutting the PCB strip results in the complete removal of the at least one plated through-hole.

18. The method of claim 17, wherein the at least one plated through-hole intersects the plating bus.

19. The method of claim 17, wherein the plating bus is formed within at least one saw street of the PCB strip.

20. The method of claim 17, wherein the at least one plated through-hole is located within a saw street.

21. The method of claim 17, wherein at least one of the PCB units is a carrier substrate.

22. The method of claim 17, wherein at least one of the PCB units is a system level substrate.

* * * * *